(12) United States Patent
Hsieh et al.

(10) Patent No.: US 8,323,857 B2
(45) Date of Patent: Dec. 4, 2012

(54) PHASE-SHIFT MASK WITH ASSIST PHASE REGIONS

(75) Inventors: Robert L. Hsieh, Los Altos, CA (US); Warren W. Flack, San Jose, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 13/066,804

(22) Filed: Apr. 25, 2011

(65) Prior Publication Data

US 2012/0156814 A1    Jun. 21, 2012

Related U.S. Application Data

(63) Continuation-in-part of application No. 12/928,862, filed on Dec. 21, 2010.

(51) Int. Cl.
*G03F 1/36* (2012.01)
(52) U.S. Cl. .......................................................... 430/5
(58) Field of Classification Search ............... 430/5, 322, 430/323, 394
See application file for complete search history.

(56) References Cited

U.S. PATENT DOCUMENTS

| | | | |
|---|---|---|---|
| 5,415,951 A | 5/1995 | Miyazaki | |
| 5,672,450 A | 9/1997 | Rolfson | |
| 6,355,382 B1 * | 3/2002 | Yasuzato et al. | 430/5 |
| 6,605,396 B2 | 8/2003 | Schroeder et al. | |
| 6,818,359 B2 * | 11/2004 | Burgess et al. | 430/5 |
| 6,869,738 B2 | 3/2005 | Oshima et al. | |
| 7,008,732 B2 | 3/2006 | Lin et al. | |
| 7,141,338 B2 | 11/2006 | Chen et al. | |
| 7,521,157 B2 | 4/2009 | Wallace | |
| 7,585,595 B2 | 9/2009 | Pierrat | |
| 7,632,610 B2 | 12/2009 | Wallace et al. | |
| 7,811,720 B2 | 10/2010 | Chen et al. | |
| 2005/0064304 A1 * | 3/2005 | Kim et al. | 430/5 |
| 2005/0271953 A1 | 12/2005 | Broeke et al. | |

OTHER PUBLICATIONS

Watson et al., "Sub-resolution assist feature and offaxis illumination optimization for 200 and 240 nm contact windows using 248 nm lithography," Optical Microlithography XI, SPIE, vol. 3334, pp. 131-139 (1998).

Gabor et al., "Sub-resolution assist feature implementation for high-Performance logic gate-level lithography," Optical Microlithography XV Proc. SPIE vol. 4691 pp. 418-425 (2002).

Yoon, "Phase-Shifted assist feature OFC for sub-45nm node optical Lithography," Opitcal Microlithography XX, Proc.SPIE vol. 6520 (2007).

* cited by examiner

*Primary Examiner* — Stephen Rosasco
(74) *Attorney, Agent, or Firm* — Opticus IP Law PLLC

(57) ABSTRACT

A phase-shift mask having a checkerboard array and a surrounding sub-resolution assist phase pattern. The checkerboard array comprises alternating phase-shift regions R that have a relative phase difference of 180 degrees. The sub-resolution assist phase regions R' reside adjacent corresponding phase-shift regions R and have a relative phase difference of 180 degrees thereto. The sub-resolution assist phase regions R' are configured to mitigate undesirable edge effects when photolithographically forming photoresist features. Method of forming LEDs using the phase-shift mask are also disclosed.

14 Claims, 16 Drawing Sheets

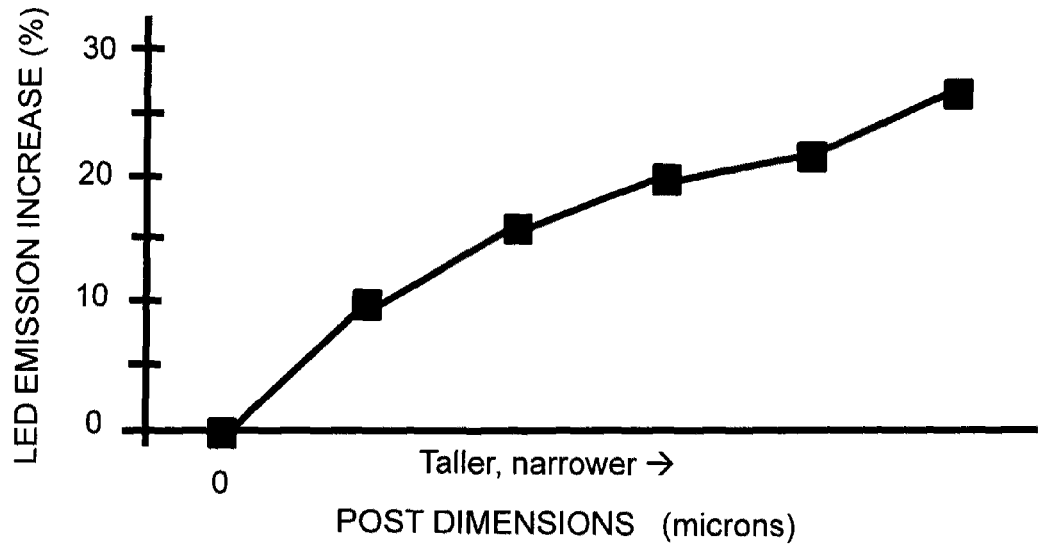
FIG. 2
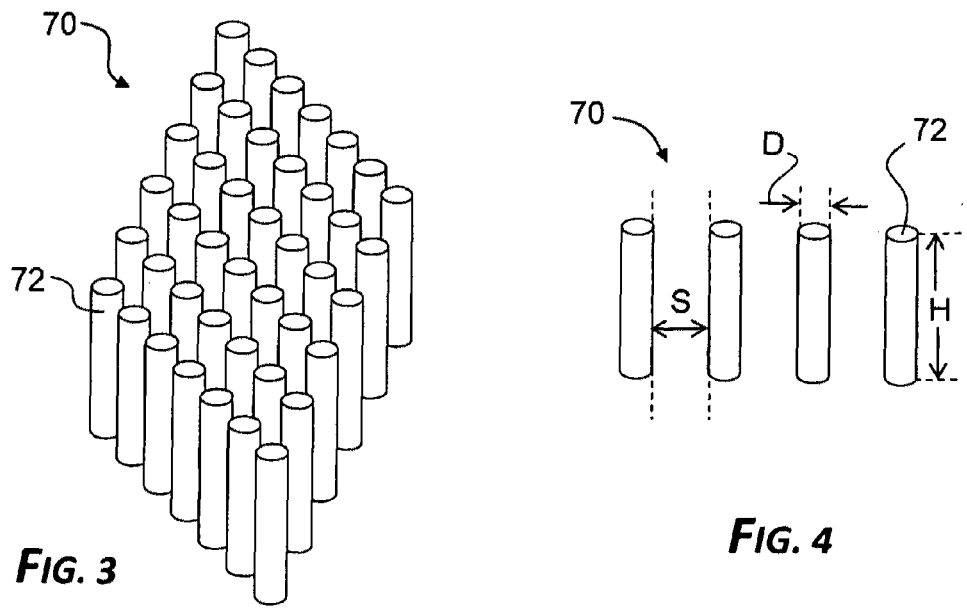
FIG. 3
FIG. 4

US 8,323,857 B2

PHASE-SHIFT MASK WITH ASSIST PHASE REGIONS

CROSS-REFERENCE TO RELATED APPLICATIONS

This application is a continuation-in-part of U.S. patent application Ser. No. 12/928,862, entitled "Photolithographic LED fabrication using phase-shift mask," filed on Dec. 21, 2010, which application is incorporated by reference herein.

FIELD

The present disclosure relates generally to phase-shift masks used in photolithography, and in particular relates to phase-shift masks having assist phase regions.

BACKGROUND ART

Phase-shift masks are used in a variety of photolithographic applications to form semiconductor integrated circuits and light-emitting diodes (LEDs). Phase-shift masks differ from conventional chrome-on-glass masks in that the transparent regions in a phase-shift mask have a relative phase difference while in a chrome-on-glass mask, the transparent regions all have the same relative phase. The benefit of having select phase differences for the transparent regions in a phase-shift mask is that the transparent regions can be configured so that the electric field amplitudes add in a manner that result in a sharper image intensity (image contrast). This in turn results in an increased imaging resolution when printing features in photoresist.

An example phase-shift mask can include alternating phase-shift regions, i.e., a periodic pattern of 0 degree and 180 degree ($\pi$) phase regions. Such a phase-shift mask is useful for enhancing feature resolution of repeating patterns. However, the improved image contrast ceases at the edge (perimeter) of the lithography exposure field because the repeating pattern must terminate. As a result, the feature patterns formed adjacent to the field edge tend to be distorted by discontinuity in the otherwise beneficial phase interference. This issue has been addressed in the past by configuring the phase-shift mask and the imaging field such that the distorted features would print in a region on the wafer that ultimately would not be used to form the actual device. However, not all manufacturing applications have this flexibility, and therefore the conventional alternating-phase phase-shift mask cannot be employed.

One example manufacturing application where distorted features at the field edge can be problematic is in LED manufacturing. LEDs are becoming increasingly more efficient due to continuous improvements in LED fabrication and LED design. However, a general limitation on LED light emission efficiency is due to a total internal reflection of the light generated within the LED. For example, in a gallium-nitride-(GaN)-based LED, n-doped and p-doped GaN layers are supported by a semiconductor substrate (e.g., sapphire) having a surface. The n-doped and p-doped GaN layers sandwich an active layer, and one of the GaN layers has a surface that interfaces with air. Light is generated in the active layer and is emitted equally in all directions. However, GaN has a relatively high refractive index of about 3. As a result, there exists at the GaN-air interface a maximum-incident-angle cone ("exit cone") within which the light exits the p-GaN-air interface, but outside of which light is reflected back into the GaN structure due to Snell's Law.

To improve LED light emission efficiency, certain LEDs have been fabricated with a roughened substrate surface. The roughened substrate surface scatters the internally reflected light, causing some of the light to fall within the exit cone and exit the LED, thereby improving the light emission efficiency of the LED.

In a manufacturing environment, it is desirable to have a controllable and consistent method of forming the roughened substrate surface so that the LEDs have an identical structure and identical performance. To this end, it is desirable that the roughened substrate surface be formed without the above-described feature pattern distortions.

SUMMARY

An aspect of the disclosure is a phase-shift mask for use in a photolithographic imaging system having a resolution limit. The phase-shift mask has a checkerboard array of phase-shift regions R sized to be at or above the resolution limit. Adjacent phase-shift regions R have a relative phase difference of 180 degrees, and the array has a perimeter. Assist phase regions R' are arranged immediately adjacent at least a portion of the perimeter, with each assist phase regions R' being sized below the resolution limit and having a relative phase-shift difference of 180 degrees relative to the adjacent phase-shift region R.

Another aspect of the disclosure is a phase-shift mask for use in a photolithographic imaging system having a resolution limit and a wavelength. The mask body has a surface, and the mask body is generally transparent to the photolithographic imaging system wavelength. The phase-shift mask includes a checkerboard array of phase-shift regions R supported by the mask body surface and sized to be at or above the resolution limit, with adjacent regions R have a phase difference of 180 degrees. The array has a perimeter that includes a plurality of edges and four corners. The phase-shift mask also includes a plurality of assist phase regions R' supported by the substrate surface. Each assist phase region R' is sized to be below the resolution limit. The assist phase regions R' are arranged immediately adjacent the plurality of edges and the four corners so as to surround the perimeter, with each assist phase region R' having a phase-shift difference of 180 degrees relative to the adjacent phase-shift region R and relative to the adjacent assist phase region R'.

Another aspect of the disclosure is a method of photolithographically patterning a semiconductor substrate. The method includes providing a semiconductor substrate having a surface that supports a layer of photoresist. The method also includes photolithographically imaging a phase-shift mask pattern onto the photoresist layer, the phase-shift mask pattern comprising a checkerboard array of phase-shift regions R, with adjacent regions R have a phase difference of 180 degrees, the array having a perimeter, and a plurality of assist phase regions R' each sized to be below the resolution limit, with the assist phase regions R' arranged immediately adjacent at least a portion of the perimeter, with each assist phase region R' having a phase-shift difference of 180 degrees relative to the adjacent phase-shift region R. The method further includes processing the photoresist layer to form a periodic array of photoresist features.

Another aspect of the disclosure is a method of forming an LED. The method includes photolithographically exposing photoresist supported by a semiconductor substrate to form therein an array of photoresist posts, including passing illumination light through a phase-shift mask having a checkerboard phase-shift pattern having a perimeter surrounded by an array of sub-resolution assist phase regions. The method also includes processing the array of photoresist posts to form an array of substrate posts that defined a roughened substrate surface. The method additionally includes forming a p-n multilayer structure atop the roughened substrate surface to form the LED, wherein the roughened substrate surface acts to scatter light generated by the p-n multilayer structure to increase an amount of light emitted by the LED as compared to the LED having an unroughened substrate surface.

Additional features and advantages of the disclosure are set forth in the detailed description that follows, and in part will be readily apparent to those skilled in the art from that description or recognized by practicing the embodiments as described herein, including the detailed description which follows, the claims, as well as the appended drawings. The claims constitute part of this specification, and are hereby incorporated into the detailed description by reference.

It is to be understood that both the foregoing general description and the following detailed description presented below are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure, and together with the description serve to explain the principles and operations of the disclosure.

BRIEF DESCRIPTION OF THE DRAWINGS

FIG. 2 is a schematic plot of the measured increase in LED (light) emission (%) versus post dimension (microns) for an LED such as shown in FIG. 1 and having a uniform array of posts that define a roughened sapphire substrate surface;

FIG. 3 is a perspective view of a portion of an example uniform array of posts;

FIG. 4 is a close-up perspective view of four adjacent posts in an array of posts, showing the edge-to-edge post spacing S, the post diameter D and the post height H;

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure. For example, in connection with the phase-shift masks disclosed herein, such masks can contain many thousands of phase regions, and in certain Figures a limited number of the phase regions are shown by way of illustration.

Aspects of the phase-shift mask with assist phase regions of the disclosure are discussed in connection with the fabrication of LEDs by way of illustration. Thus, information relating to LED structure and fabrication using photolithography are set forth below.

Example LED structure

Figure 1:
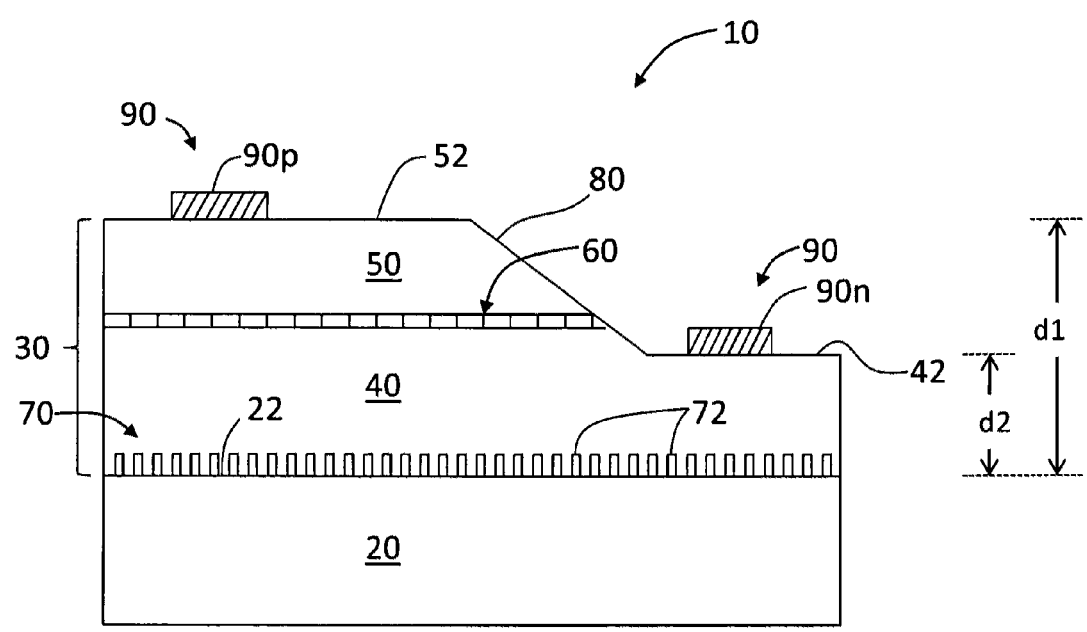
FIG. 1 is a schematic cross-sectional diagram of an example GaN-based LED that includes a roughened substrate surface defined by an array of posts.

FIG. 1 is a schematic cross-sectional diagram of an example GaN-based LED 10. Example GaN-based LEDs are described in U.S. Pat. Nos. 6,455,877 and 7,259,399 and 7,436,001, which patents are incorporated by reference herein. The present disclosure is not limited to GaN-based LEDs, and is directed to any type of LED formed using photolithographic imaging and processing techniques and that could benefit from an increased light emission due to a roughened substrate surface formed by an array of posts as described herein.

LED 10 includes a substrate 20 having a surface 22. Example materials for substrate 20 include sapphire, SiC, GaN, Si, etc. Disposed atop substrate 20 is a GaN multilayer structure 30 that includes an n-doped GaN layer ("n-GaN layer") 40 and a p-doped GaN layer ("p-GaN layer") 50 with a surface 52. The n-GaN layer 40 and the p-GaN layer 50 sandwich an active layer 60, with the n-GaN layer being adjacent substrate 20. In other Ga-based LED embodiments, GaN multilayer structure 30 is reversed so that the p-GaN layer 50 is adjacent substrate 20. Active layer 60 comprises, for example, a multiple quantum well (MQW) structure such as undoped GaInN/GaN superlattices. GaN multilayer structure 30 thus defines a p-n junction, and is also referred to herein more generally as a p-n junction multilayer structure. In examples, surface 52 can be roughened to increase the LED light emission therethrough.

Substrate surface 22 includes an array 70 of posts 72 that define a substrate surface roughness. In an example described in greater detail below, array 70 of posts 72 is etched into substrate surface 22 so that posts 72 are made of the substrate material. To increase LED light emission efficiency, posts 72 preferably have dimensions (e.g., a diameter or width D) that are 2× to 10× larger than the emitted LED wavelength $\lambda_{LED}$. It is important to note that while the emitted LED wavelength $\lambda_{LED}$ might be, for example, between 400 and 700 nm, the LED wavelength in the GaN layers 40 and 50 is roughly 2.5× smaller because of the GaN index of refraction n, which makes the wavelength in the GaN layers approximately 150 nm to 250 nm (i.e., $\lambda_{LED}/n$). In an example, to efficiently scatter the light within n-GaN layer 40, posts 72 have a dimension D of about 0.5 micron to about 3 microns. Also in an example, the edge-to-edge spacing S between posts 72 can vary from 0.5 micron to 3 microns, and the post height H can be up to about 3 microns (see FIG. 3 and FIG. 4).

LED 10 is shown in FIG. 1 as having a sloped portion 80 formed in GaN multilayer structure 30. Sloped portion 80 forms an exposed surface portion 42 of n-GaN layer 40 that acts as a ledge for supporting one of two electrical contacts 90, namely n-contact 90n. Example n-contact materials include Ti/Au, Ni/Au, Ti/Al, or combination thereof. The other electrical contact 90 is the p-contact 90p, which is arranged on p-GaN surface 52. Example p-contact materials include Ni/Au and Cr/Au. An example distance d1 is about 4 microns, and an example distance d2 is about 1.4 microns. An example LED 10 is typically 1 mm×1 mm square.

Increasing LED Light Emission Efficiency

FIG. 2 is a schematic plot of a measured increase in LED (light) emission (%) versus post dimension (microns) for an LED such as shown in FIG. 1 and having uniform array 70 of posts 72 that define roughened surface 22 in a sapphire substrate 20. FIG. 3 is a perspective view of a portion of an example uniform array 70 of posts 72. FIG. 4 is a close-up perspective view of three posts 72 in array 70 showing the edge-to-edge post spacing S, the post diameter D and the post height H. The LED light emission for an LED having an unroughened sapphire surface 22 is shown for reference at the "0" location, and the increase in LED light emission is measured relative to this reference value (0%). The post dimensions in the plot generally get taller and narrow to the right of the "0" or "unroughened" location.

From the plot of FIG. 2, it is observed that the LED light emission generally increases for taller and narrower posts 72. For a uniform array 70, overlay requirements are not severe and occasional defects are not particularly problematic. However, the size of posts 72 is important, as is the repeatability and consistency of the high-volume process used to form the posts. It is noted that posts 72 can have any reasonable cross-sectional shape and are shown as cylindrical posts with a round cross-section by way of illustration. Posts 72 can be non-cylindrical (i.e., have sloped or non-straight sidewalls), can have rectangular or square cross-sectional shapes, a kidney-bean type shape, etc. FIG. 14E introduced and discussed below illustrates by way of example pyramidal posts 72. In an example, photoresist posts 72' can be cylindrical but the corresponding posts 72 subsequently formed in the substrate surface 22 are non-cylindrical due to the process used to form the substrate posts 72 from the photoresist posts 72'.

Generally speaking, example posts 72 formed at or near the resolution limit of the photolithographic imaging process used to form the posts (as discussed below) have a rounded cross-sectional shape rather than sharp edges. Thus, the post diameter or width D is meant herein as a representative or effective dimension of the cross-sectional size of the post and is not limited to any particular shape. For example, post diameter D may refer to the major axis diameter of a post having an elliptical cross-sectional shape.

As discussed above, posts 72 can have a sub-micron diameter D, e.g., D=0.5 micron. Forming such posts using present-day photolithographic techniques would typically require a photolithographic system capable of imaging 0.5 micron features. Such systems, however, are typically designed for traditional semiconductor integrated circuit manufacturing for forming the critical layers (i.e., the layers having the smallest dimensions) and are generally considered prohibitively expensive for LED manufacturing.

Aspects of the present disclosure include photolithographic systems and methods for forming an array 70 of posts 72 on substrate surface 22 to fabricate LEDs having increased LED light emission efficiency as compared to the same LEDs having a smooth substrate surface. However, the systems and methods described herein are suitable for being carried out using non-critical-layer photolithographic systems in combination with a select type of phase-shift mask. The phase-shift mask is matched to the photolithography system's numerical aperture and illumination (i.e., "sigma") to form posts 72 having desired dimensions. This allows the photolithography system to print much smaller posts over a suitable depth of focus (DOF) than is possible using a traditional chrome-on-glass non-phase-shift mask.

Photolithographic Imaging

It is well known that grating-like structures can be produced in photoresist using two intersecting coherent light beams. Under normal conditions, two coherent beams with incident angles θ and wavelength λ can interfere to produce a periodic grating-like structure in the photoresist whose period P is given by $P=\lambda/(2*\sin\theta)$. A two-dimensional grid-like (checkerboard) pattern in an x-y plane can be made by superimposing four coherent beams, namely two beams in the x direction and two beams in the y direction.

Figure 5:
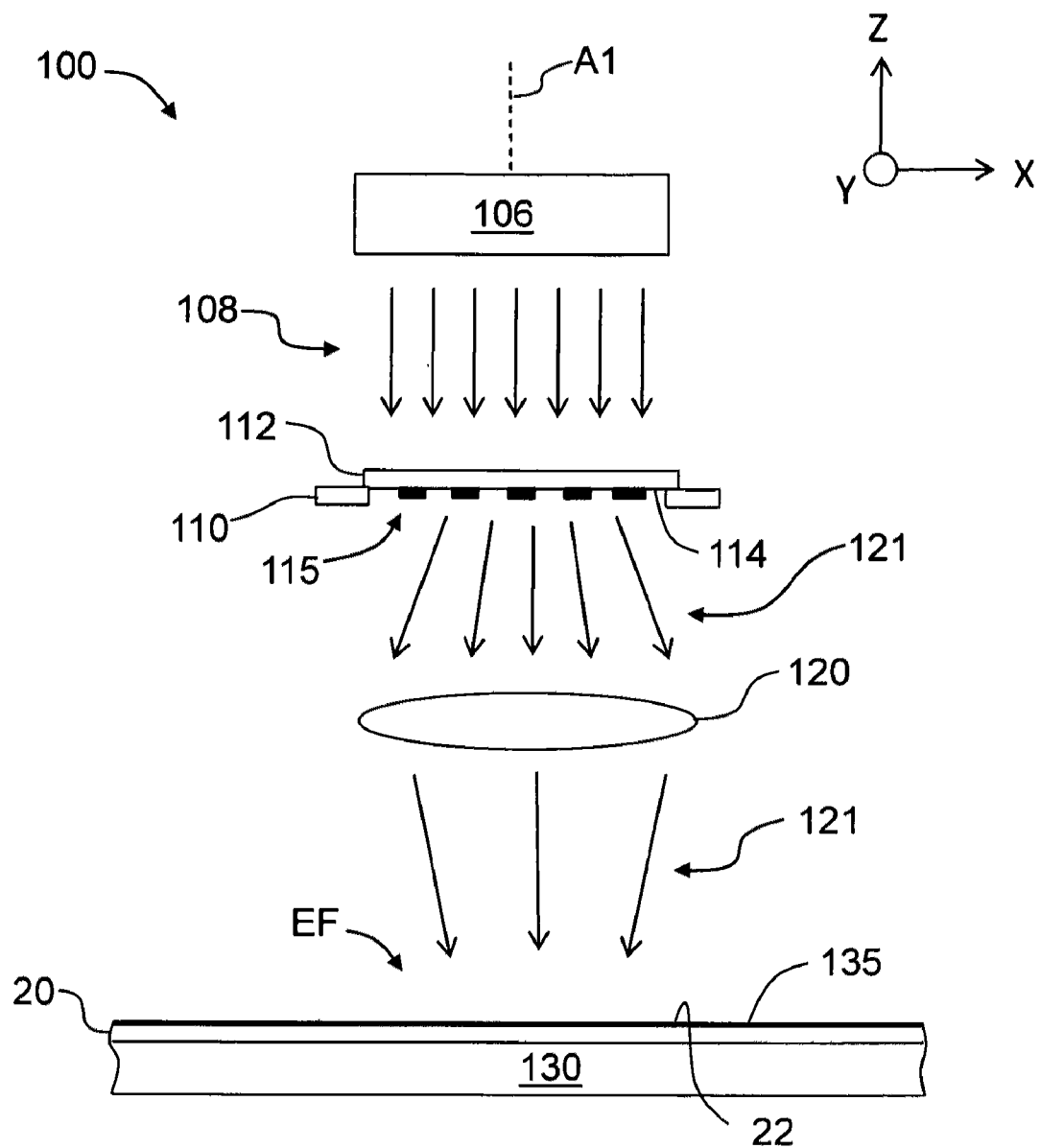
FIG. 5 is a schematic diagram of a generalized photolithography system used to conduct photolithographic imaging and to generally carry out the methods of the disclosure.
Figure 6:
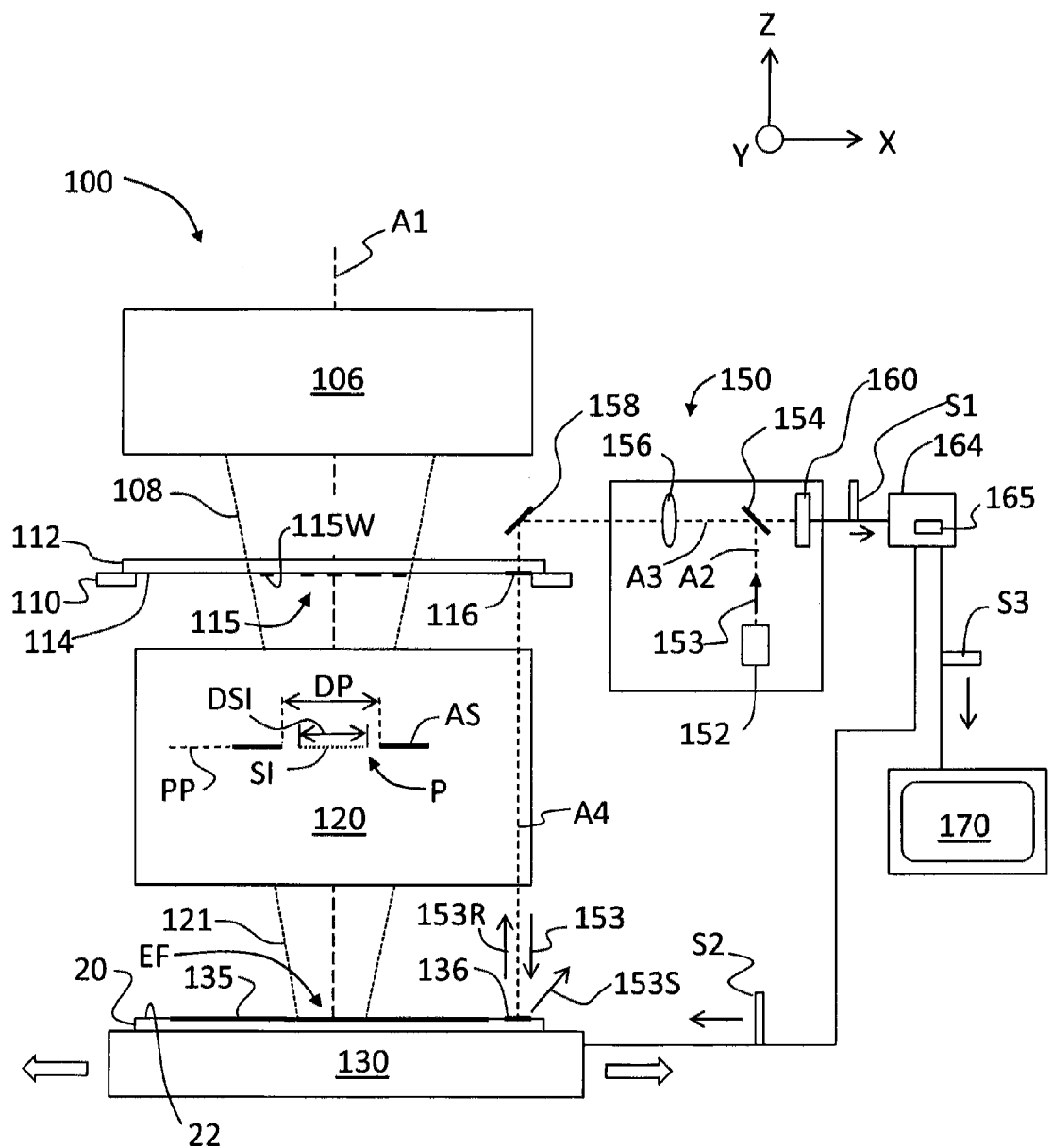
FIG. 6 is a more detailed schematic diagram of an example of the photolithography system shown in FIG. 5.

FIG. 5 is a schematic diagram of a generalized photolithography system 100, and FIG. 6 is a more detailed schematic diagram of an example photolithography system 100. Cartesian X-Y-Z coordinates are shown for reference. Photolithographic system 100 is configured to perform photolithographic imaging, which is also referred to herein as "photolithographic exposure" because the imaging results in the exposure of a photosensitive material, namely photoresist. Photolithographic imaging or photolithographic exposure generally means capturing light that passes through a mask and imaging the captured light at an image plane within a DOF, wherein a photosensitive material is arranged generally within the DOF to record the image.

With reference to both FIG. 5 and FIG. 6, photolithography system 100 includes, along a system axis A1, an illuminator 106, a mask stage 110, a projection lens 120, and a moveable substrate stage 130. Mask stage 110 supports a phase-shift mask 112 that is transparent to an exposure wavelength of light used by photolithographic system 100. Phase mask 112 has a body 111 with a surface 114 that supports a phase-shift mask pattern 115 formed thereon.

The amount of phase shift generated by a layer of material of thickness d and refractive index n is given by $\Delta\phi=2\pi(n-1)d/\lambda$ where $\lambda$ is the photolithographic imaging wavelength. An example material for phase mask 112 is quartz or fused silica. In an example, phase-shift mask pattern 115 is formed by selective etching mask surface 114 to create regions of different thickness, by selectively adding phase-shifting material to the mask surface to create region of different thickness, or by a combination of these methods.

Substrate stage 130 supports substrate 20. Substrate 20 may be in the form of a wafer. In an example, photolithography system 100 is a 1:1 system (i.e., unit magnification system) that has a numerical aperture of about 0.3 and operates at mid-ultraviolet wavelengths such as the i-line (nominally 365 nm). In another example, a reduction photolithography system can be used. In an example, photolithography system 100 is suitable for use in processing non-critical layers in a semiconductor process. An example photolithography system 100 suitable for carrying out the systems and methods disclosed herein is the Sapphire™ 100 photolithography system, available from Ultratech, Inc., San Jose, Calif.

An example projection lens 120 includes a variable aperture stop AS that defines a pupil P with a diameter DP and that defines a pupil plane PP. Illuminator 106 is configured to illuminate phase-shift mask 112 by providing a source image SI that fills a portion of pupil P. In an example, source image SI is a uniform circular disc with a diameter DSI. The partial coherence factor of photolithography system 100 is defined as $\sigma=DSI/DP$, where pupil P is assumed to be circular. For different source images SI other than a simple uniform disc, the definition of the partial coherence a becomes more complicated. In an example, the illumination of phase-shift mask 112 is Kohler illumination or a variant thereof.

Photolithography system 100 also includes an optical alignment system 150, such as a through-the-lens alignment system as shown, which may utilize a machine-vision alignment system. Example optical alignment systems are disclosed in U.S. Pat. Nos. 5,402,205 and 5,621,813 and 6,898,306, and in U.S. patent application Ser. No. 12/592,735, which patents and patent application are incorporated by reference herein.

Figure 7:
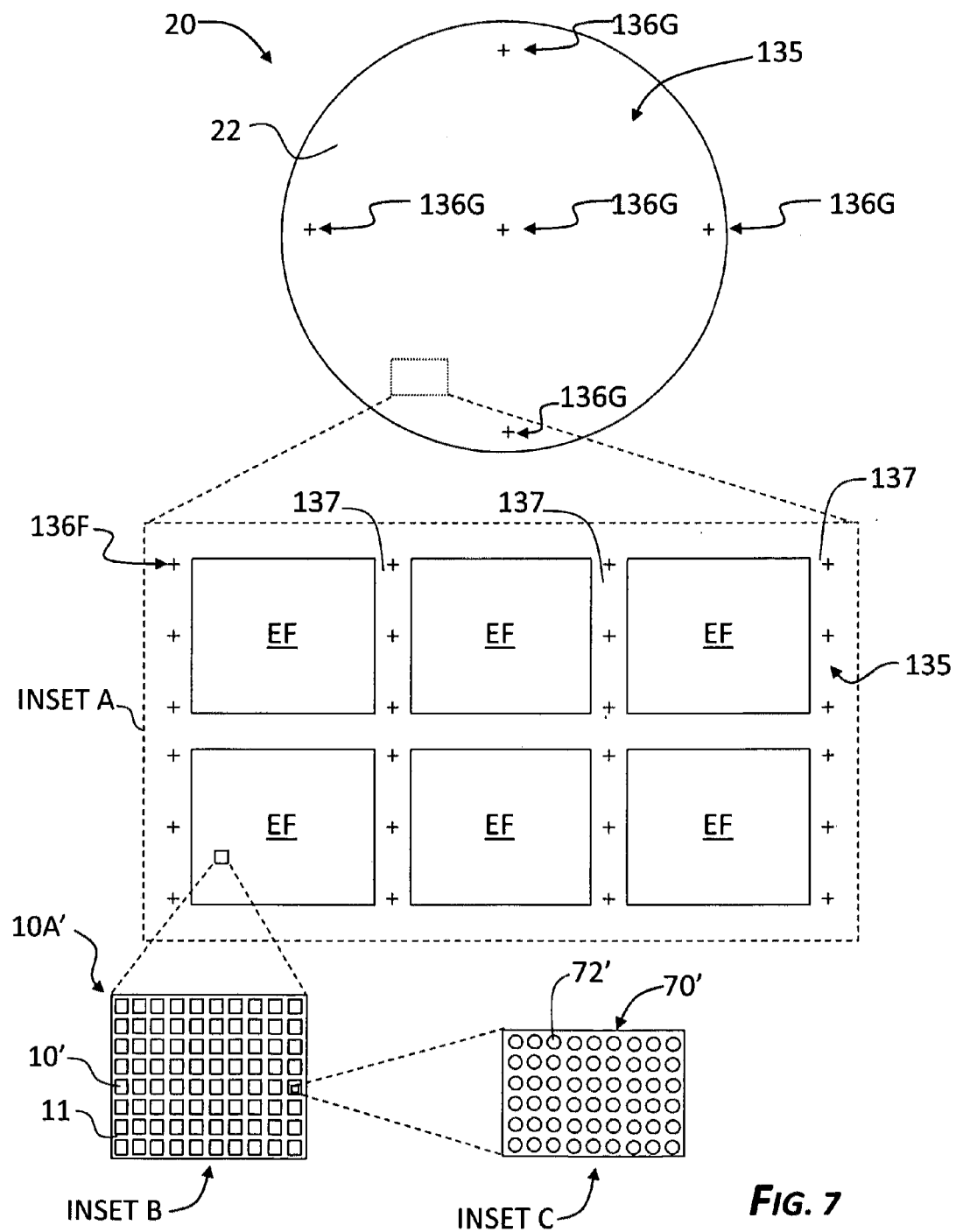
FIG. 7 is a plan view of an example substrate that has exposure fields as well as global and fine alignment marks, and also includes an Inset A that shows the exposure fields, an Inset B that shows LED regions within the exposure fields, and an Inset C that shows an array of photoresist posts formed in the LED regions.

FIG. 7 is a plan view of an example substrate 20 that has exposure fields EF as formed by photolithography system 100, and also includes global alignment marks 136G used for global alignment, as well as fine alignment marks 136F for fine alignment (see Inset A). Note that in the example shown that both types of alignment marks 136 reside in scribe areas 137 between or adjacent exposure fields EF. Exposure fields EF are discussed in greater detail below in connection with their formation using phase-shift mask 112 in the photolithographic process of forming LEDs 10.

With reference again to FIG. 6, an example optical alignment system 150 includes a light source 152 arranged along an axis A2 and that emits alignment light 153 of wavelength $\lambda_A$. A beam splitter 154 is arranged at the intersection between axis A2 and a perpendicular axis A3. A lens 156 and a fold mirror 158 are arranged along axis A3. Fold mirror 158 folds axis A3 to form an axis A4 that is parallel to lithography system axis A1. Axis A4 travels through mask 112, through projection lens 120 and to substrate 20. Alignment system 150 also includes an image sensor 160 arranged along axis A3 adjacent beam splitter 154 on the side opposite lens 156 and fold mirror 158. Image sensor 160 is electrically connected to an image processing unit 164 configured to process digital images captured by image sensor 160. Image processing unit 164 is electrically connected to a display unit 170 and also to moveable substrate stage 130.

In the general operation of photolithography system 100, light 108 from illuminator 106 illuminates mask 112 and pattern 115 thereon, and the pattern is imaged onto substrate surface 22 over a select exposure field EF (FIG. 7) via exposure light 121 from projection lens 120. The alignment patterns 115W form substrate alignment marks 136. Substrate surface 22 is typically coated with a light-sensitive material such as photoresist layer 135 (FIG. 5) so that phase-shift mask pattern 115 can be recorded and transferred to substrate 20.

Photolithography system 100 is used to form a relatively large number (e.g., thousands) of LEDs 10 on a single substrate 20 using photolithographic imaging (photolithographic exposure) in combination with photolithographic processing techniques. The layers making up LEDs 10 are formed, for example, in a step-and-repeat or step-and-scan fashion and then processed together. Thus, prior to imaging phase-shift mask pattern 115 onto photoresist layer 135 to form the array of exposure fields EF, the mask pattern must be properly aligned to the previously formed layer, and in particular to the previously formed exposure fields. This is accomplished by aligning substrate 20 relative to mask 112 using one or more of the aforementioned substrate alignment marks 136 and an alignment reference, which in alignment system 150 is one or more mask alignment marks 116.

Thus, in the operation of alignment system 150, alignment light 153 from light source 152 travels along axis A2 and is reflected by beam splitter 154 along axis A3 towards lens 156. Light 153 passes through lens 156 and is reflected by fold mirror 158 to pass through mask 112 and projection lens 120 and to illuminate a portion of substrate surface 22, including substrate alignment mark 136. A portion 153R of light 153 is reflected from substrate surface 22 and substrate alignment mark 136 and travels back through projection lens 120 and through mask 112, and in particular through mask alignment mark 116. In the case where substrate alignment mark 136 is diffractive, then the diffracted light from the substrate alignment mark is collected.

The combination of projection lens 120 and lens 156 forms from reflected light 153R a superimposed image of the substrate alignment mark 136 and mask alignment mark 116 on image sensor 160. Here, mask alignment mark 116 serves as an alignment reference. In other types of optical alignment systems such as off-axis systems, the alignment reference is the alignment system optical axis as calibrated based on lithography system fiducials.

Image sensor 160 generates an electrical signal Si representative of the captured digital image and sends it to image processing unit 164. Image processing unit 164 is adapted (e.g., via image processing software embodied in a computer-readable medium such as a memory unit 165), to perform image processing of the received digital image. In particular, image processing unit 164 is adapted to perform pattern recognition of the superimposed substrate and mask alignment mark images to measure their relative displacement and generate a corresponding stage control signal S2 that is sent to substrate stage 130. Image processing unit 164 also sends an image signal S3 to display unit 170 to display the superimposed substrate and mask alignment mark images.

In response to stage control signal S2, substrate stage 130 moves in the X, Y plane (and also in the Z-plane, if necessary, for focusing purposes) until the images of mask and substrate alignment marks 116 and 136 are aligned (i.e., directly superimposed), indicating proper alignment of phase-shift mask 112 and substrate 20.

With reference again to FIG. 5, the imaging of phase-shift mask pattern 115 can be viewed as a diffraction process whereby light 108 incident upon mask 112 is diffracted by phase-shift mask pattern 115 to form diffracted light 121, with some of this diffracted light (i.e., the lowest diffraction orders, e.g., the zero order and the plus and minus first orders) being captured by projection lens 120 and imaged onto photoresist layer 135. The quality of the image formed by projection lens 120 is directly related to the number of the diffracted orders it collects, as well as to the projection lens aberrations. Note that the zero-order diffracted beam is simply a straight-through component that contributes a "DC" background level of intensity to the image and as such is generally not desired.

Thus, when the photolithographic imaging process is viewed as a diffraction process, photolithography system 100 can be configured to optimize this diffraction process to form a desired image. In particular, with the proper design of phase-shift mask 112 and the phase-shift regions therein, the zero-order diffracted beam can be eliminated. Further, with a proper choice of the numerical aperture for projection lens 120, one can select which diffracted orders will contribute to the photolithographic imaging process. Specifically, the numerical aperture can be adjusted so that only the two first-order diffracted beams are captured by projection lens 120.

Moreover, the aforementioned grid-like or checkerboard pattern can be formed at substrate 20 by creating a two-dimensional periodic phase-shift mask pattern 115 on phase-shift mask 112 so that first-order beams are generated in both the x-direction and the y-direction. However, care must be taken to ensure that the zero-order beam is substantially eliminated, and to do so the electric field for the transmitted zero-order beam must be substantially zero in amplitude. This is accomplished in one embodiment by configuring phase-shift mask 112 so that the different phase-shift regions have the same area.

Example Phase-Shift Masks

Figure 8A:
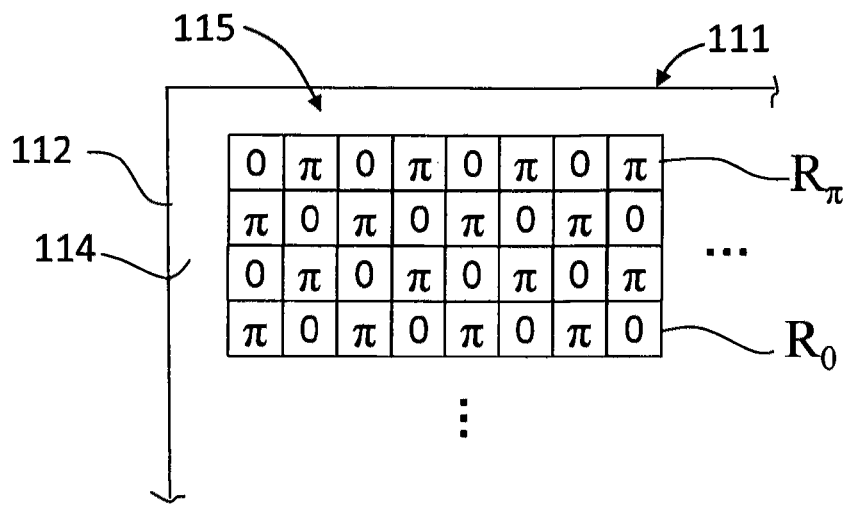
FIG. 8A is a schematic diagram of a portion of an example phase-shift mask where the mask pattern comprises regions R, with transmissive regions $R_0$ having a 0° phase shift and transmissive regions $R_\pi$ having 180° ($\pi$) phase shift.

FIG. 8A is a schematic diagram of a portion of an example phase-shift mask 112 where phase-shift mask pattern 115 comprises transmissive phase-shift features or regions R, with transmissive phase-shift regions $R_0$ having a 0° phase shift and transmissive phase-shift regions $R_\pi$ having a 180° ($\pi$) phase shift.

Figure 8B:
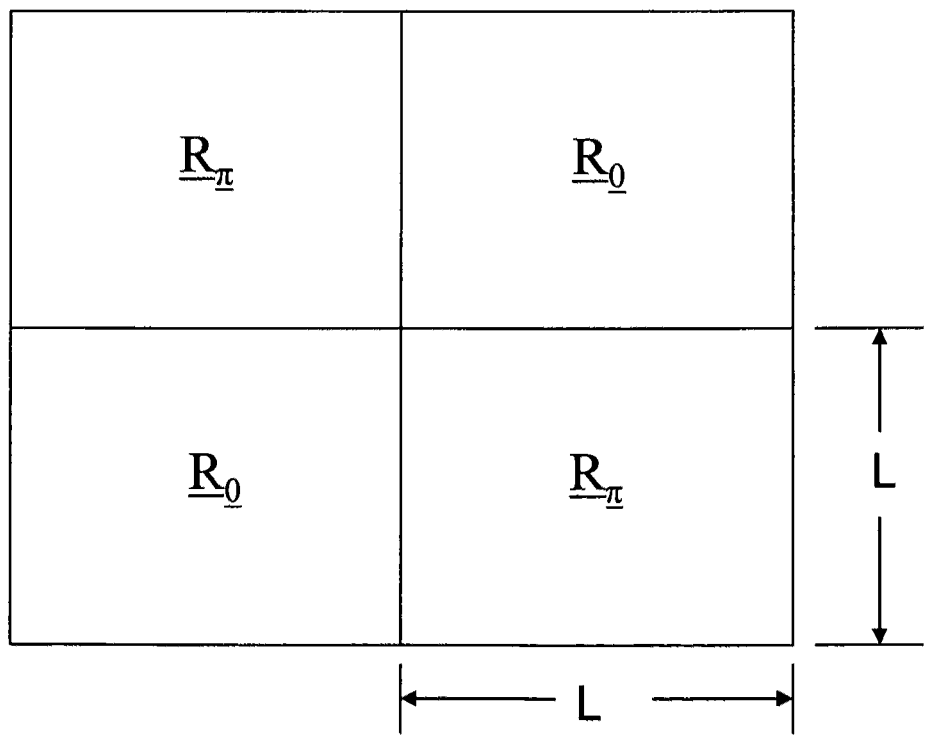
FIG. 8B is a close-up view of four regions R of the phase-shift mask of FIG. 8A.

FIG. 8B is a close-up view of four phase-shift regions R of phase-shift mask 112 of FIG. 8A. Phase-shift regions $R_0$ and $R_\pi$ are square with a dimension (side length) L, with the phase-shift regions R having equal area and configured in a checkerboard pattern or array. In an example embodiment, phase-shift regions R can have any reasonable shape, and in particular can have at least one of a circular shape, oval shape and a polygonal shape.

Photolithography system 100, when configured with phase-shift mask 112 having a checkerboard phase-shift mask pattern 115, can perform photolithographic imaging to form in photoresist layer 135 corresponding periodic (e.g., checkerboard) features with dimensions of about L/2, i.e., substantially half that of dimension L of the phase-shift regions R of the phase-shift mask. Specifically, there is a spatial-period doubling during the imaging process, whereby the spatial period of phase-shift mask pattern 115 is substantially doubled at substrate surface 22, so that twice as many dark and light regions are created at the substrate 20. This is because the zero-order diffraction beam has been eliminated, allowing for combination of the zero-order beam with each first-order beam that reproduces the original spatial period of the mask 112. By eliminating the zero-order beam, only the two first-order beams are imaged. When these two first-order beams are combined, they produce a sinusoidal pattern with twice the spatial period of the original mask pattern. Thus, when L=1 micron, photoresist features having a dimension of L/2=0.5 micron can be formed.

A rule of thumb in photolithographic imaging is that the minimum feature size FS that can be printed (i.e., imaged into photoresist layer 135 with sharp features) with a photolithography system 100 having an imaging wavelength $\lambda_I$ and a NA is $FS=k_1\lambda_I/NA$, where $k_1$ is a constant typically assumed to be between 0.5 and 1, depending on the particular photolithographic process. The DOF is given by $k_2\lambda_I/NA^2$, where $k_2$ is another process-based constant that depends on the particular photolithographic process and is often approximately 1.0. Thus, there is a tradeoff between feature size FS and DOF.

Substrates 20 used for LED manufacture are traditionally not nearly as flat as substrates used in semiconductor chip manufacturing. In fact, most LED substrates 20 have a warpage (due to MOCVD processing) that exceeds many tens of microns (peak-to-valley) across the substrate surface 22, and about 5 microns (peak-to-valley) over each exposure field. This degree of non-planarity has generally been considered highly problematic for using a photolithography imaging process to form LEDs 10 because of the attendant limited DOF relative to the amount of substrate non-flatness.

In a traditional photolithographic process that uses conventional photolithography photoresists, the minimum feature size (linewidth) that can be created in the photoresist is given by $0.7*\lambda_I/NA$ (i.e., $k_1$ is equal to 0.7). For the condition where it is desirable to print features that are 1 micron in size, the required NA is 0.255 when using an imaging wavelength of $\lambda_I$=365 nm. With this NA, the DOF for an unaberrated imaging system is 5.6 microns, which is on the order of the within-field substrate non-flatness of a typical LED substrate 20. This means that it will be difficult to get an entire exposure field EF to reside within the DOF. Consequently, posts 72 that are formed outside of the DOF will not meet the necessary size and shape requirements.

However, when using a phase-shift mask 112 and conventional photolithography photoresists, the minimum feature size that can be printed is given by $0.3*\lambda_I/NA$ (i.e., $k_1$ is equal to 0.3). This has the practical effect of reducing the needed NA by about half and increasing the DOF by about 4× as compared to using a conventional mask. Thus, for a given post diameter D, $NA=k_1\lambda_I/D$, and the DOF becomes:

$$DOF=k_2\lambda_I/NA^2=k_2\lambda_I/[k_1\lambda_I/D]^2=k_2D^2/k_1^2\lambda_I$$

By way of example, to photolithographically expose photoresists in order to obtain posts 72 that have a diameter D=1 micron using an imaging wavelength $\lambda_I$=365 nm, the required NA is now only 0.11, and the DOF is now over 30 microns so that each exposure field EF for non-flat LED substrates 20 will fall well within the DOF.

In an example, photolithography systems 100 used to carry out the methods described herein have a relatively low projection lens NA (e.g., of 0.5 or lower) as compared to present-day critical-level projection lens NAs (e.g., of 0.5 and greater), and also have a relatively large imaging wavelength (e.g., of about $\lambda_I$=365 nm, or any of the other mercury lines), as compared to present-day critical level imaging wavelengths (e.g., deep UV at a wavelength of 193 nm). Consequently, lower-NA, longer-wavelength photolithography systems 100 are preferred because they are generally much less expensive to purchase, operate and maintain than the higher-NA, shorter-wavelength advanced photolithography systems used for critical levels in semiconductor manufacturing of integrated circuits.

Figure 9A:
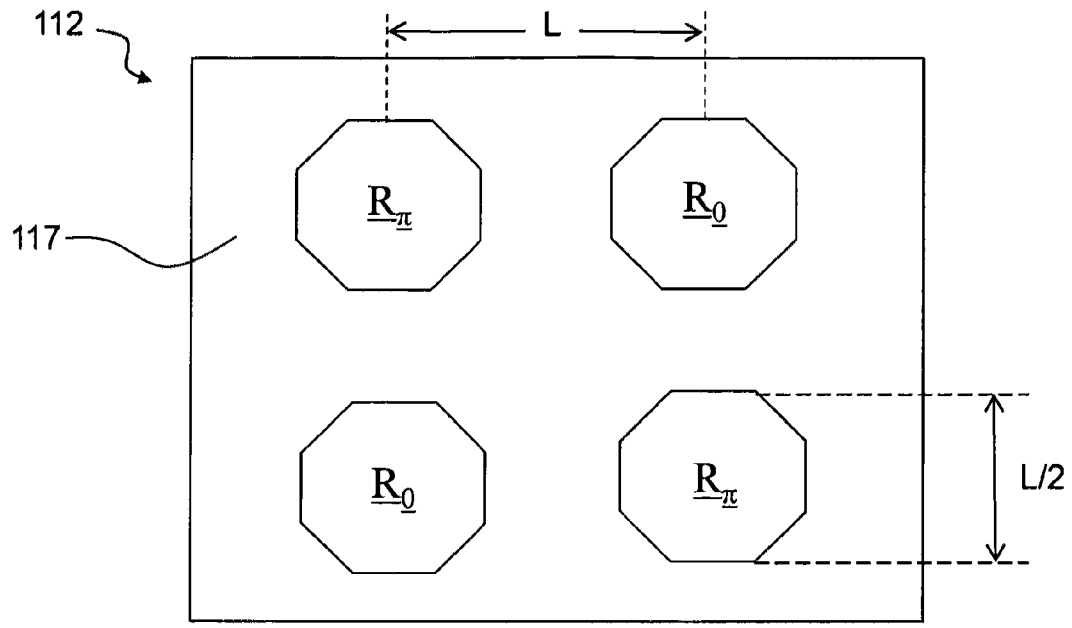
FIG. 9A is a schematic diagram of another example phase-shift mask that can be used to form an array of sub-micron posts, wherein the phase-shift regions are spaced apart and have a polygonal shape.
Figure 9B:
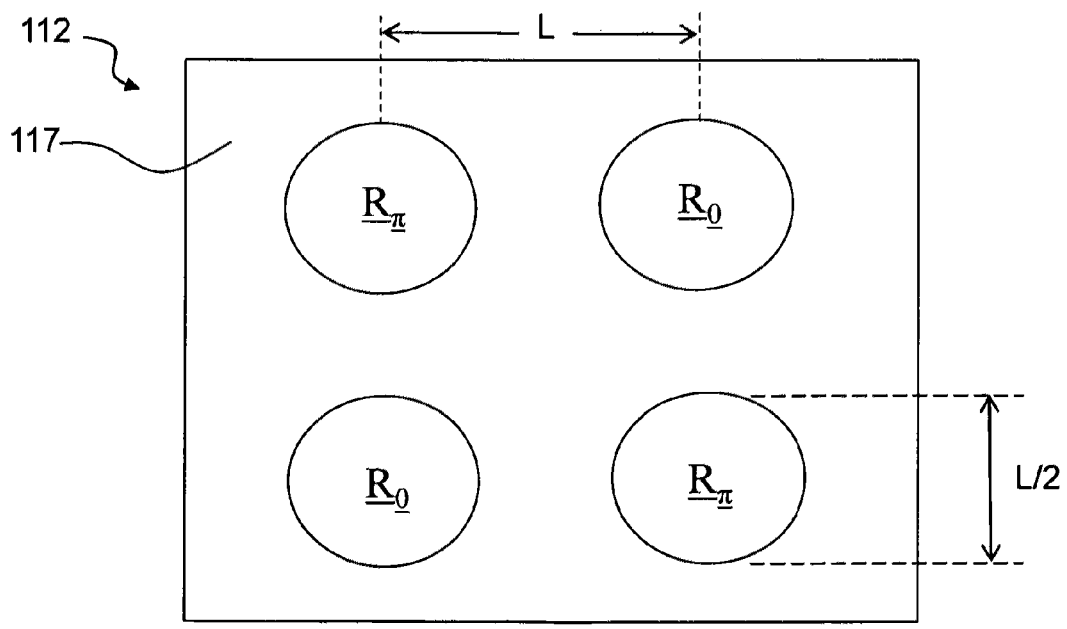
FIG. 9B is similar to FIG. 9A, but wherein the phase-shift regions are circular.

FIG. 9A is a schematic diagram of another example phase-shift mask 112 that can be used to form an array 70 of posts 72 having a sub-micron dimension. The phase-shift mask 112 of FIG. 9A is similar to that of FIG. 8A and FIG. 8B, except that there is an opaque background section 117, and phase-shift regions $R_0$ and $R_\pi$ have dimensions L/2 and are spaced apart from one another. Phase-shift regions $R_0$ and $R_\pi$ are shown as being octagonal by way of illustration of an example type of polygonal phase-shift regions. FIG. 9B is similar to FIG. 9A, but illustrates an example phase-shift mask 112 wherein the phase-shift regions R are circular.

Opaque background section 117 can be coated with an absorber layer, such as chrome or aluminum. Phase-shift regions $R_0$ and $R_\pi$ are printed in photoresist layer 135 with substantially the same dimension L/2, which is beyond the traditional resolution limit of a 1 micron design photolithography system 100. An advantage of the configurations of phase-shift masks 112 of FIG. 9A and FIG. 9B is that it is easier to control the geometry and spacing of the final photolithographic image that forms array 70 of posts 72.

Figure 10:
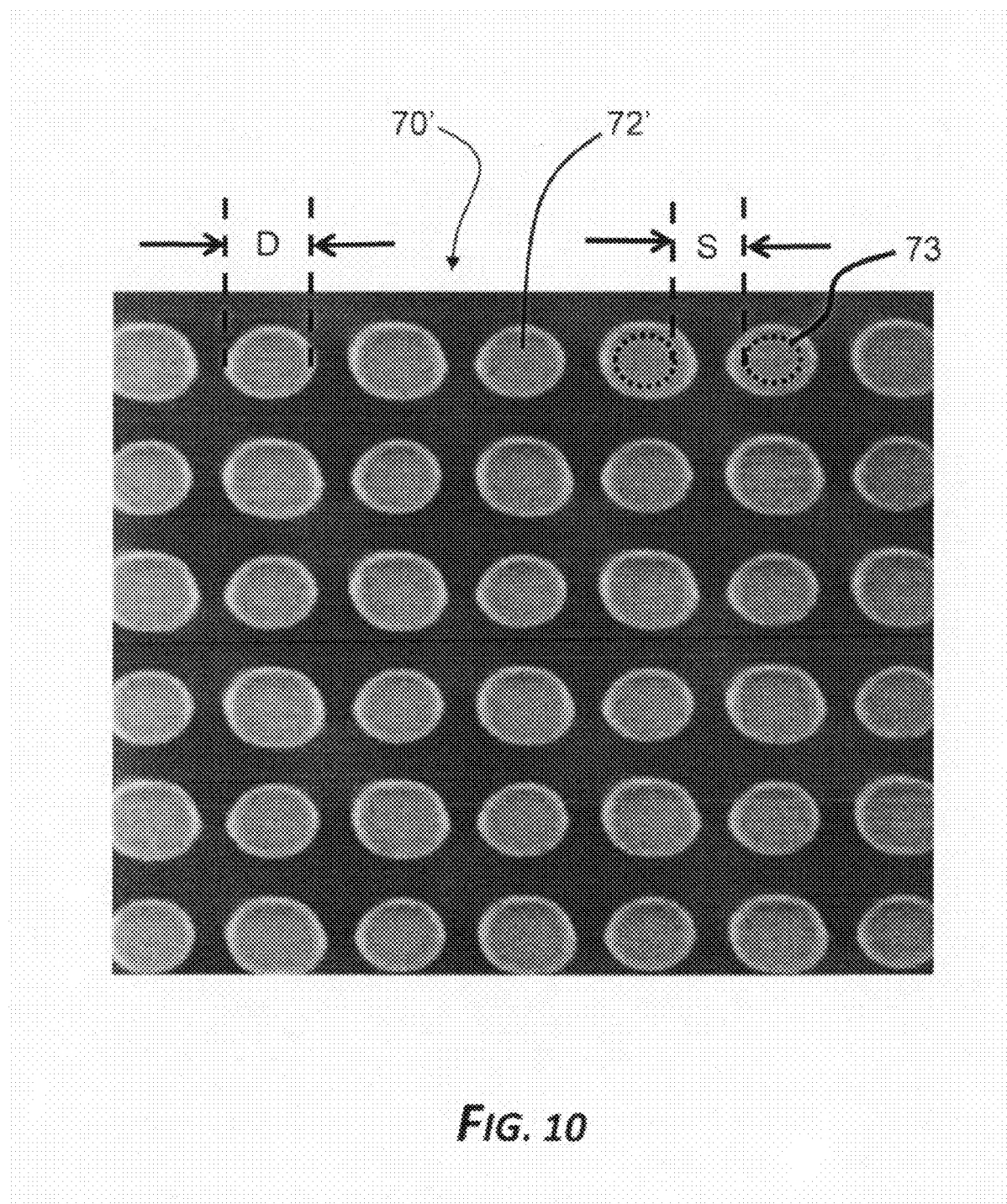
FIG. 10 is a scanning electron microscope image of an example array of pillars formed as photoresist posts having a 3 micron thickness and using a phase-shift mask similar to that of FIG. 8A, with regions $R_0$ and $R_\pi$ and with L/2=0.6.

FIG. 10 is a scanning electron microscope (SEM) image of an example array 70' of photoresist posts 72' formed in a negative photoresist layer 135 having a 3 micron thickness and using a phase-shift mask 112 similar to that of FIG. 8A, with phase-shift regions $R_0$ and $R_\pi$ with L/2=0.6. The diameter (width) D of each photoresist post 72' is about 0.6 microns. It is noted again that the shape of posts 72' can vary (e.g., be undercut, have sloped sidewalls, etc.) so that the two dashed circles 73 represent an estimation of the actual size and shape of the posts 72' for the sake of illustration.

Phase-Shift Mask with Assist Phase Regions

Figure 11A:
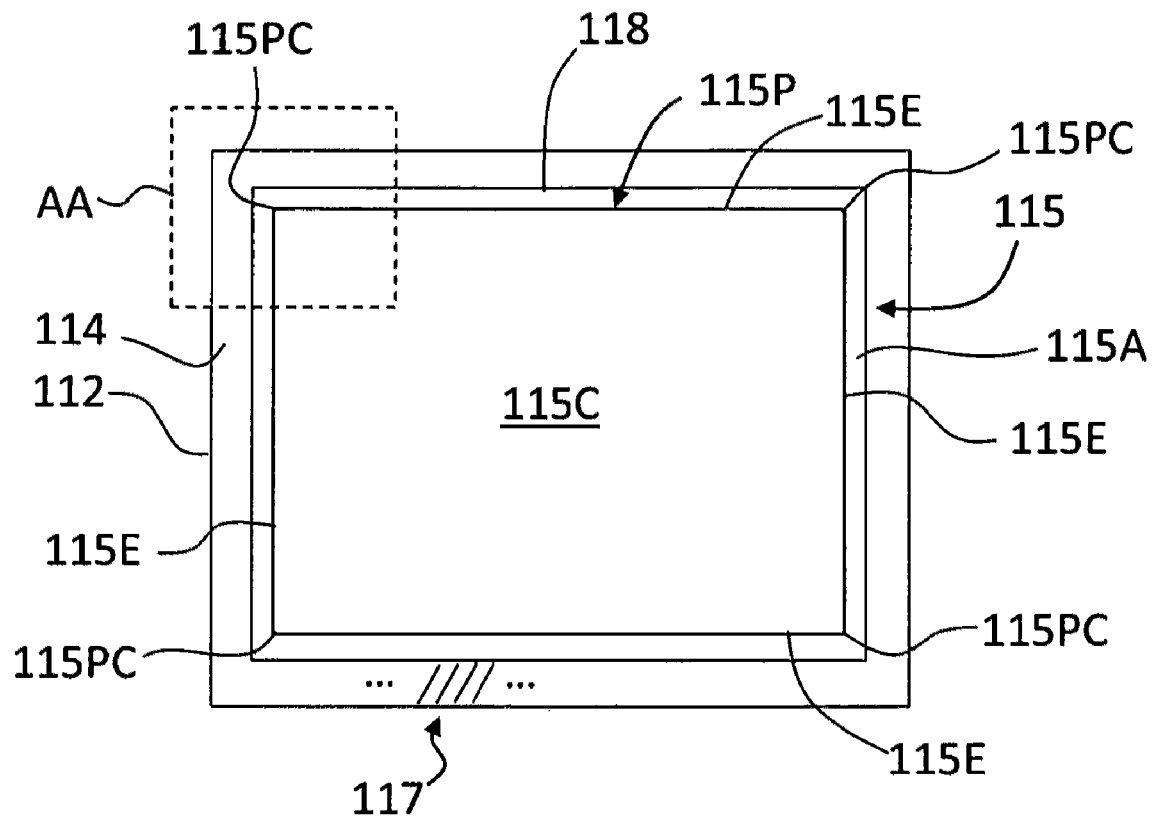
FIG. 11A is top-down view of an example chrome-less phase-shift mask having the checkerboard array of FIG. 8A, but that also includes sub-resolution assist phase regions.
Figure 11B:
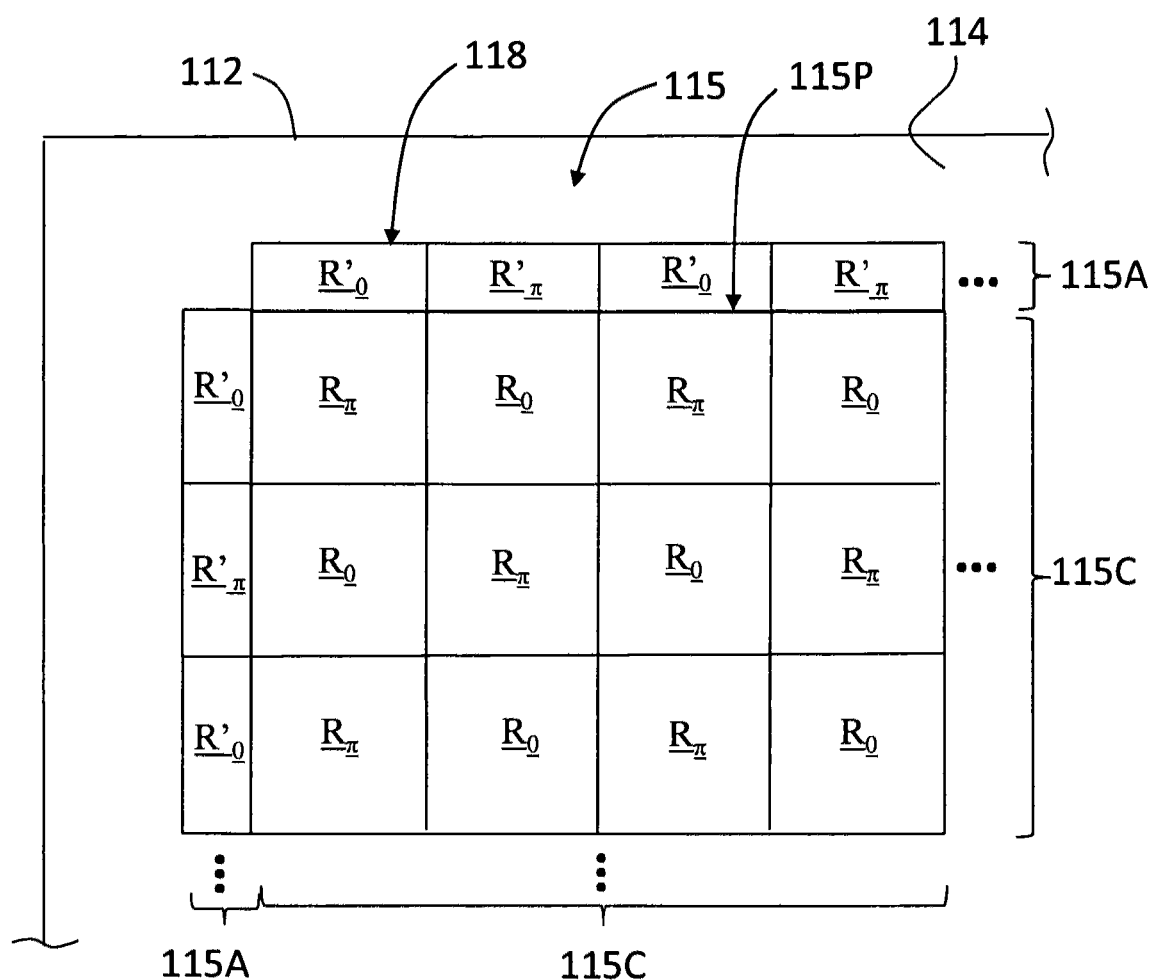
FIG. 11B is a close-up view of an example of the inset region denoted as AA in FIG. 11A showing a portion of the phase-mask pattern that includes the main checkerboard phase-shift pattern and the corresponding example configuration of assist phase regions.

FIG. 11A is top-down view of an example chrome-less phase-shift mask 112 similar to that shown in FIG. 8A. FIG. 11B is a close-up view of the inset region of FIG. 11A denoted as AA. Phase-shift mask 112 of FIG. 11A includes a pattern 115 supported by mask surface 114 and similar to that shown in FIG. 8A. Pattern 115 has a central (or interior or main) checkerboard array 115C with alternating phase regions $R_0$ and $R_\pi$. Checkerboard array 115C has a perimeter 115P that includes edges 115E and four corners 115PC. Note that regions R need only have their phase shifts differ by π (180 degrees) and that any combination of phase regions R that satisfy this condition can be used, e.g., $R_{\pi/2}$ and $R_{3\pi/2}$, etc. Phase regions R generally are sized to be at or above the resolution limit of the particular photolithographic system in which phase-shift mask 112 is intended to be used, i.e., the phase regions are sized to form a suitable or usable feature in photoresist layer 135 or like medium.

Pattern 115 further includes an assist pattern or array 115A surrounding the central checkerboard-pattern 115C at edge 115E. Assist pattern or array 115A comprises sub-resolution assist phase regions (regions) R' arranged immediately adjacent at least a portion of perimeter 115P, such as at one or more edges 115E. Here, sub-resolution means that the assist phase regions R', when imaged by a photolithographic imaging system having a resolution limit, do not result in the formation of what would normally be considered a suitable or usable feature, such as, for example, a resist feature like a photoresist post 72'. Each assist phase region R' has a phase opposite that of the adjacent phase regions R of checkerboard array 115C. Assist phase regions R' define a perimeter 118 for assist pattern 115A.

In one example, determining whether a given assist phase region R' is sub-resolution can be determined by actually photolithographically imaging phase-shift mask 112 in a photosensitive medium such as a photoresist layer and seeing if any of the assist phase regions formed in the photoresist layer could be considered a suitable or usable feature based on what the phase-shift mask is being used to print.

In an example, at least some of the assist phase regions R' have one dimension that is the same as the adjacent phase region R in checkerboard array 115C, and another dimension that is substantially smaller (e.g., e.g., ½ the size or smaller) than that of the adjacent phase region R.

In an example, surface 114 outside of phase-shift mask pattern 115 (i.e., immediately adjacent perimeter 118 of assist phase regions R') includes opaque layer 117 so that the exposure field EF has sharp edges (see FIG. 11A).

In an example, assist phase regions R' are located outside of the stepping area of phase-shift mask pattern 115, i.e., only checkerboard array 115C falls within the area that is actually imaged within the exposure field EF. When exposure fields EF are stitched, the unprinted areas associated with assist phase regions R' overlap with the pattern in the next exposure field EF.

Figure 11C:
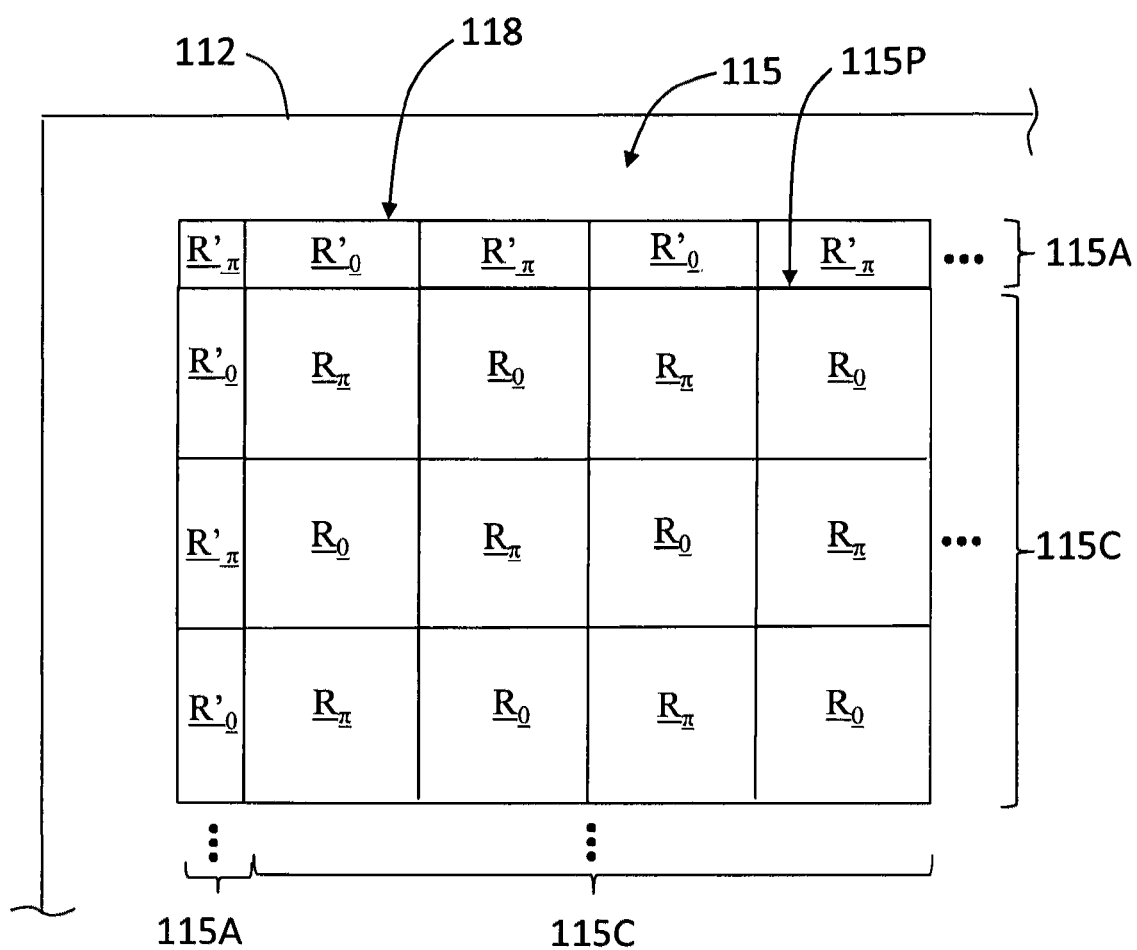
FIG. 11C is similar to FIG. 11B but wherein the assist phase regions configuration further includes a corner assist phase region.

FIG. 11C is similar to FIG. 11B but shows another example of the phase-mask pattern 115 but wherein the assist phase regions configuration further includes one or more assist phase region R' respectively disposed at one or more of the corners. The corner assist phase region R' shown in FIG. 11B has a π phase shift to maintain the checkerboard array pattern. Also, in an example, the corner assist phase region R' is smaller than the non-corner phase regions arranged adjacent checkerboard array edges 115E. Thus, in an example embodiment, assist phase regions R' are configured to surround (e.g., immediately surround) checkerboard array perimeter 115P. In another example embodiment, assist phase regions R' are configured to at least partially surround checkerboard array perimeter 115P.

Exposure fields EF can be stitched together to form a large array 70' of photoresist posts 72'. This is because forming an LED includes forming an array 70 of posts 72 in substrate 20 as the first patterned layer in the LED process. Using a photolithographic system 100 that steps between exposure fields EF, it is possible to construct a process that incorporates scribe lines. However, this is not how the traditional LED fabrication process was developed using full wafer aligners. Presently, in LED manufacturing, there are no scribe areas (also called scribe lines) 137 anywhere on the wafer (substrate 20). Rather, substantially the entire wafer is formed to include an array 70' of posts 72' without any substantial breaks, i.e., a substantially continuous array 70' and thus a substantially continuous array 70.

This configuration of posts 72 is possible because the subsequent layers used in forming the LED do not need to align to array 70. This allows for wafers with array 70 to be generic in that they can be used for any LED device regardless of die size. Since the array 70 so formed is not device specific, it can be formed by the wafer supplier instead of the device manufacturer. Since only one phase-mask 112 is needed for each type of array 70 (e.g., each post size for posts 72), the cost of phase-shift mask 112 can be amortized over all devices that use the same array 70.

In phase-shift mask 112, checkerboard array 115C effectively serves as an infinite array with respect to the interior portion of the exposure field EF. In practice, for example, phase-shift mask 112 is used to form thousands of LEDs, wherein each LED includes the formation of thousands of posts 72 (see FIG. 1), so that there are many thousands of phase-shift regions R and R' making up checkerboard array 115C and assist pattern 115A. However, when pattern 115 only includes checkerboard array 115C so that its perimeter 115P terminates at the boundary of the corresponding lithography exposure field, the features at the perimeter of the exposure field are distorted due to the lack of phase interference beyond the edge.

Figure 12A:
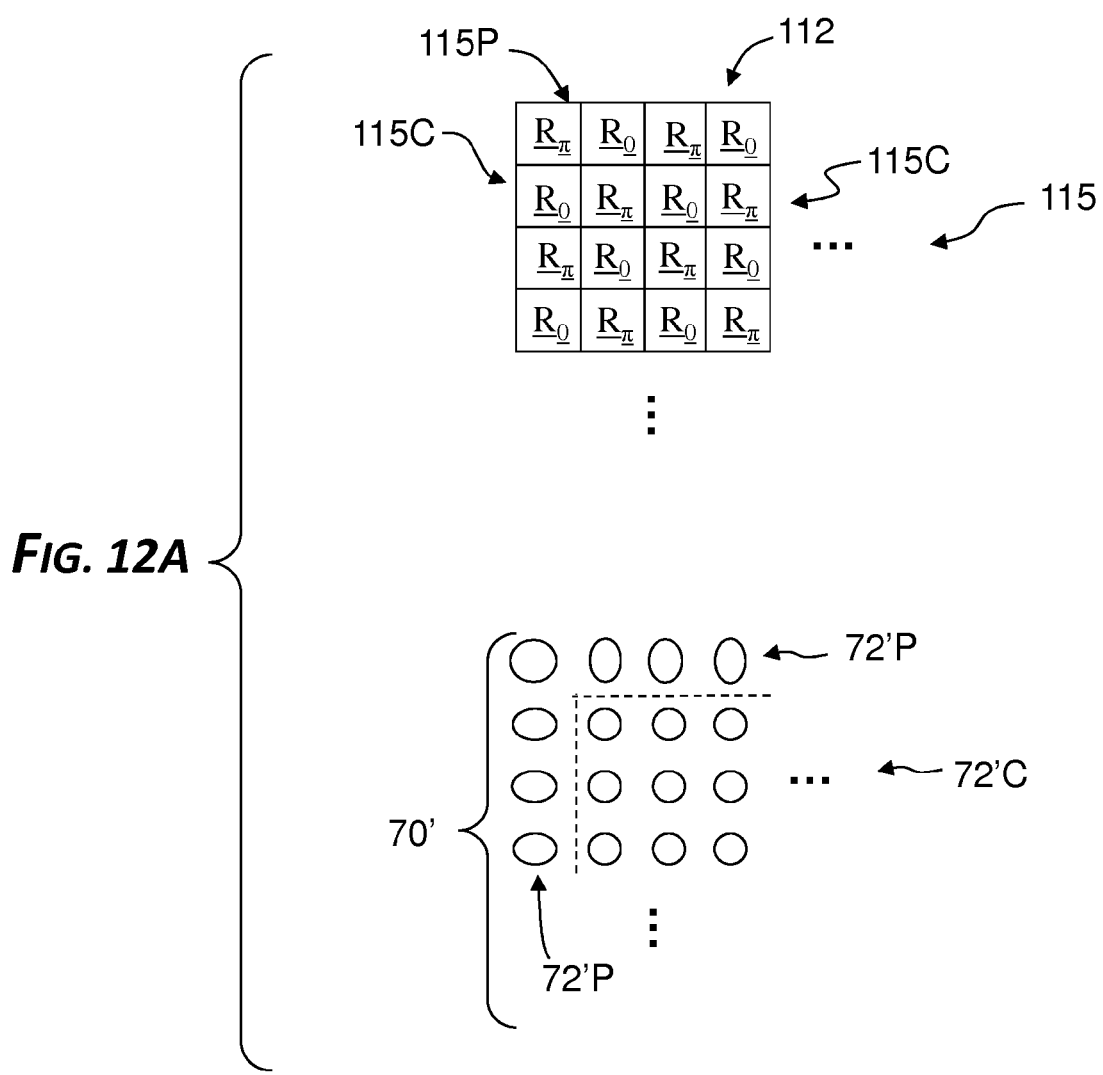
FIG. 12A schematically illustrates an example of an array of photoresist posts formed by a checkerboard-pattern phase-shift mask that does not include sub-resolution assist phase regions, showing how the perimeter posts are distorted relative to the interior (central) posts.

FIG. 12A schematically illustrates the formation of a (negative) array 70' of photoresist posts 72' using a phase-shift mask 112 wherein pattern 115 only includes checkerboard array 115C. Array 70' includes perimeter posts 72'P formed at the perimeter of the exposure fields and interior or central posts 72'C formed inside of the perimeter posts. Note that the perimeter posts 72'P are distorted relative to the interior posts 72'C. The perimeter posts 72'P and the interior or central posts 72'C are shows separated by a dashed line for ease of illustration to distinguish between these two types of posts.

Figure 12B:
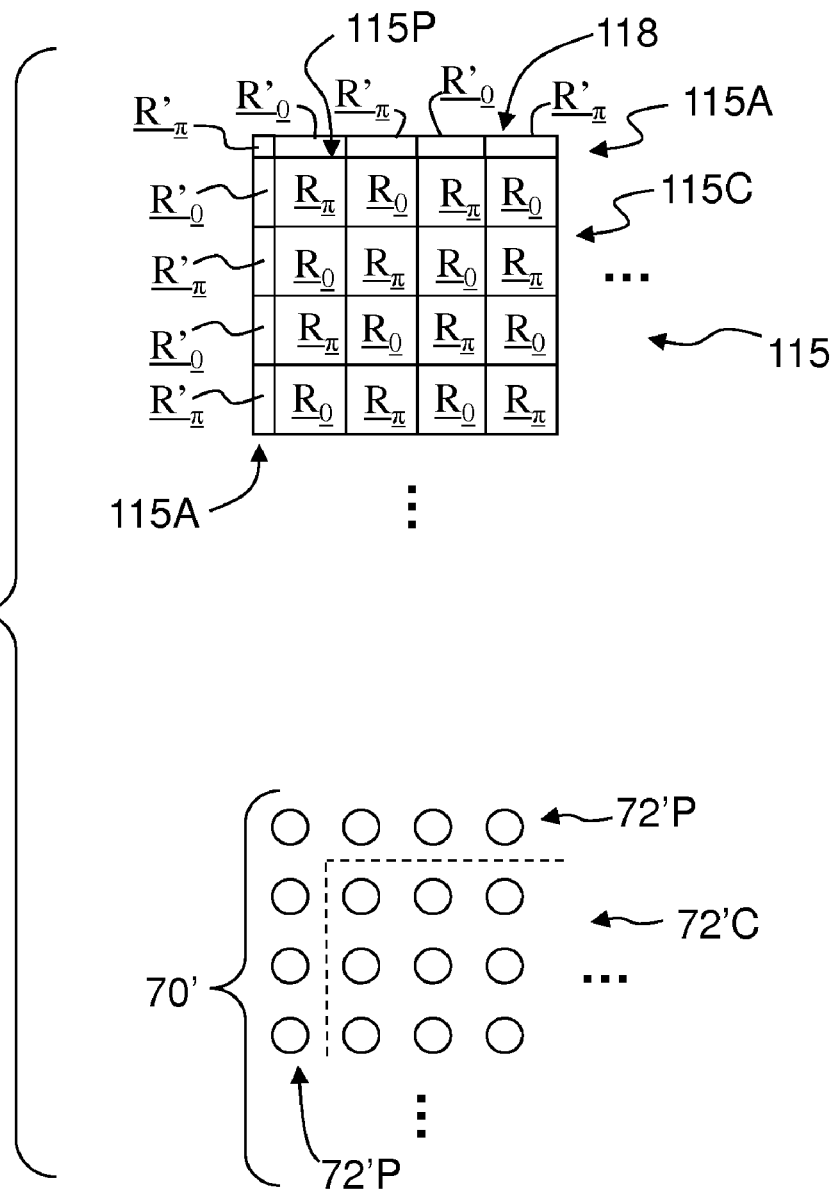
FIG. 12B is similar to FIG. 12A but with the checkerboard-pattern phase-shift mask including the sub-resolution assist phase regions and showing how the perimeter photoresist posts are substantially the same as the interior posts.

FIG. 12B is similar to FIG. 12A but with phase-shift mask 112 further including assist phase regions R' with the perimeter-surrounding configuration shown in FIG. 11B. The resulting array 70' of photoresist posts 72' includes perimeter posts 72'P that have substantially the same shape as interior posts 72'C by virtue of the assist phase regions R'. This configuration for phase-shift mask 112 reduces (and can be used to minimize) the exposure of adjacent photoresist areas, enabling subsequently exposed photoresist patterns of adjacent exposure fields to be stitched together without a gap.

Figure 13:
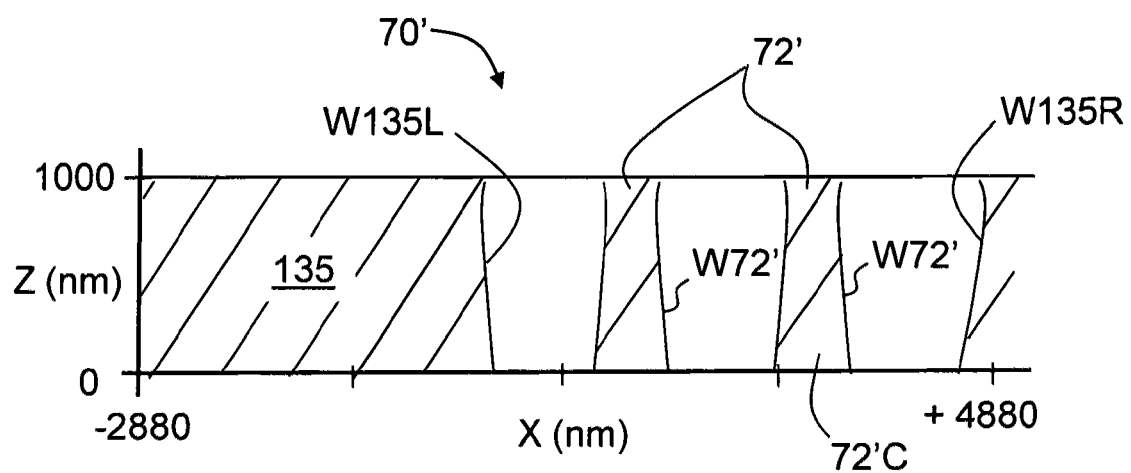
FIG. 13 is a cross-sectional view of a 2D modeled array of (positive) photoresist posts formed in a photoresist layer as based on data generated using photolithographic modeling software and illustrating the beneficial effect of the sub-resolution assist phase regions.

FIG. 13 is a cross-sectional view of a 2D modeled array 70' of (positive) photoresist posts 72' formed in a photoresist layer 135 as based on data generated using the PROLITH® photolithographic imaging simulation software, available from KLA-Tencor, Milpitas, Calif. The phase-shift mask 112 used in the photolithographic exposure simulation included a few 1.6 micron square phase-shift regions R arranged in a checkerboard (alternating) pattern with 0.4 micron wide assist phase regions R' on only the left side of the phase-shift mask. The simulated photolithographic exposure used an i-line wavelength of 365 nm with a projection lens numerical aperture (NA) of 0.28 and a partial coherence factor σ=0.57, which gives the photolithographic projector a feature resolution limit of $(0.7)\lambda/NA \sim 1$ micron.

The shape of wall W72' of the left-most resist wall W135L of photoresist layer 135 closely resembles that of the left-most post 72', which in turn closely resembles the adjacent post (denoted 72'C for center or interior post), indicating good feature formation all the way to the left edge of the exposure field. On the other hand, the resist wall W135R of photoresist layer 135 associated with the unassisted right edge of phase-shift mask 112 is distorted relative to the other photoresist walls, indicating less-than-optimal feature formation on the right edge of the exposure field.

The number N of phase-shift regions R and the number N' of assist phase regions R' on a given phase-shift mask 112 depends on the size of exposure field EF and pitch of posts 72 in array 70. For an exposure field dimension $S_{EF}$ and a pitch $P_{72}$ of posts 72, the number N of phase-shift regions R is given by $N=(S_{EF}/P_{72})^2$. By way of example, for $S_{EF}=10$ mm and $P_{72}=0.0016$ mm, $N=(10/0.0016)^2=3.9\times10^7$. The number of assist phase regions N arranged at all four edges of the phase-shift mask is given by $N'=4*(10/0.0016)=2.5\times10^4$. This number increases by 4 if assist phase regions are added at the four corners checkerboard array 115C.

Example Method for Forming the Roughened Substrate Surface

Thus, an aspect of the disclosure includes a method of forming a roughed substrate surface 22 having an array 70 of posts 72 in the course of forming LEDs 10 using photolithographic imaging and photolithographic processing techniques using phase-shift mask 112 with assist phase regions R' as described above. An example method of forming array 70 of posts 72 is now described with reference to FIG. 6 and also to FIGS. 14A through 14E.

Figure 14A:
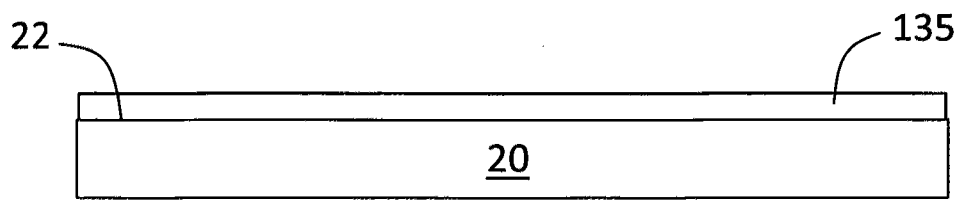
FIGS. 14A through 14E are schematic example cross-sectional views of a substrate being processed to form an array of posts in the substrate surface using photolithographic imaging with a phase-shift mask and photolithographic processing techniques in the course of forming LEDs according to the present disclosure.

With reference first to FIG. 14A, the method includes providing a substrate 20 having photoresist layer 135 atop substrate surface 22. The method then includes arranging the coated substrate 20 on substrate stage 130 of photolithography system 100 (FIG. 6). The phase-shift mask 112 as described above (see, e.g., FIGS. 11A through 11C) that includes checkerboard array 115C and assist pattern 115A is arranged at mask stage 110 of photolithography system 100. The method then includes operating photolithography system 100 to perform photolithographic imaging whereby phase-shift mask 112 is exposed with illumination light 108, and the resultant diffracted light 121 from phase-shift mask pattern 115 is captured and imaged by projection lens 120 to expose photoresist layer 135 over an exposure field EF to form an array 70' of photoresist posts 72' over substantially the entire exposure field. This is illustrated in FIG. 14B.

With reference to FIG. 7, note that many LED regions 10' are formed in photoresist layer 135 for each exposure field EF. Thus, in an example where phase-shift mask pattern 115 has an area of 15 mm×30 mm, and where each LED 10 is 1 mm square, there are 450 LED regions 10' associated with each exposure field EF, which is also 15 mm×30 mm when photolithography system 100 operates at unit magnification. Inset B in FIG. 7 shows an array 10A' of LED regions 10' associated with the formation of LEDs 10. The LED regions 10' are separated by scribe areas 11. However, array 70' of photoresist posts 72' is formed everywhere over exposure field EF (see FIG. 7, Inset C), including in scribe areas 137 shown in Inset A. Field-to-field stitching may be required at the exposure field borders. Since phase-shift mask 112 is configured to mitigate the distortion of features formed at the perimeter of exposure field EF, this facilitates the stitching process and obviates the need to have a portion of the exposure field (e.g., the exposure field edges) reside in scribe areas 137.

Figure 14B:
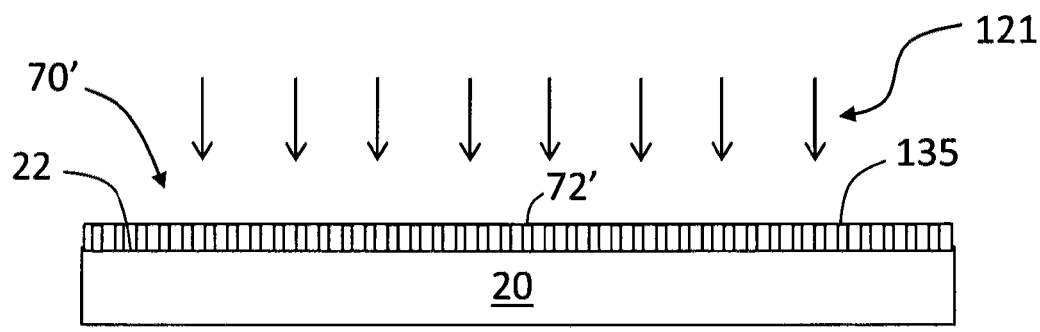
Figure 14C:
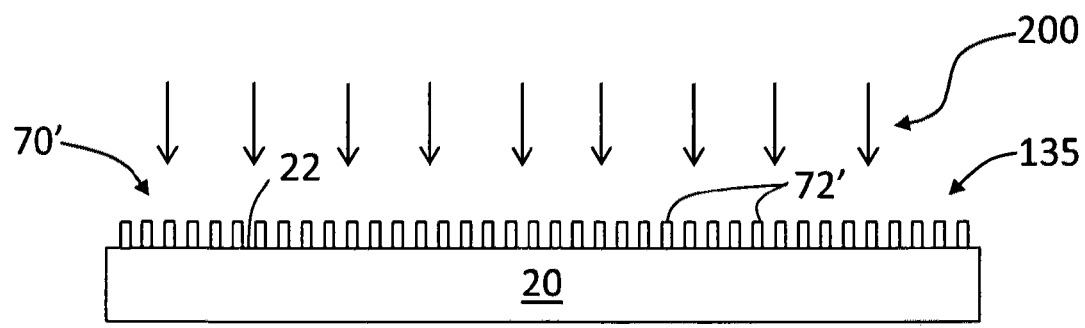

With reference now to FIG. 14C, the exposed photoresist layer 135 of FIG. 14B is processed to remove unexposed resist (negative photoresist) or to remove exposed resist (positive photoresist) to leave array 70' of photoresist posts 72' or its complementary feature, a hole. This photoresist array 70' is then etched using standard photolithographic etching techniques as indicated by arrows 200 to transfer the photoresist pattern into the substrate 20, thereby forming array 70 of posts 72 in substrate surface 22, as shown in FIG. 14D.

Figure 14D:
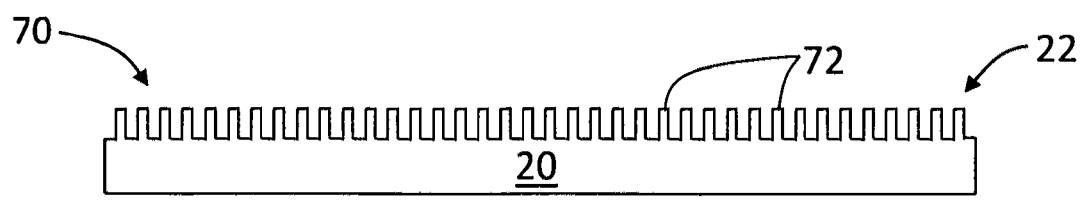
Figure 14E:
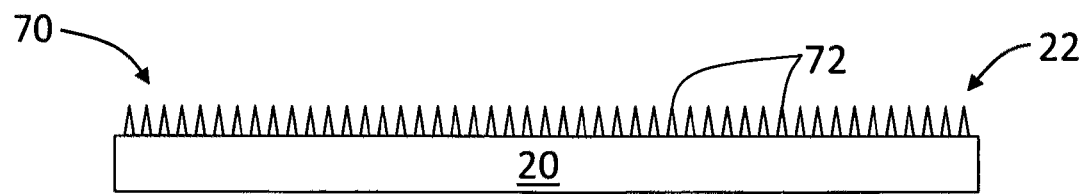

FIG. 14E is similar to FIG. 14D and illustrates an example where posts 72 in array 70 have a non-cylindrical shape, i.e., the pyramidal shape as shown. Such shapes for posts 72 formed in substrate surface 22 may be obtained from non-pyramidal photoresist posts 72' using the aforementioned etching techniques.

Now that substrate 20 is configured with a plurality of LED regions 10' having a suitably post-roughened substrate surface 22, LEDs 10 are fabricated using standard photolithography-based LED fabrication techniques. This includes, for example, forming p-n multilayer structure 30 atop the roughened substrate surface 22 and then adding p-contact 90p and n-contact 90n to layers 50 and 40, respectively, as shown in FIG. 1.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A phase-shift mask for use in a photolithographic imaging system having a resolution limit, comprising:
   a checkerboard array of phase-shift regions R sized to be at or above the resolution limit, with adjacent phase-shift regions R having a relative phase difference of 180 degrees, the array having a perimeter; and
   a plurality of assist phase regions R' arranged immediately adjacent at least a portion of the perimeter, with each assist phase regions R' being sized below the resolution limit and having a relative phase-shift difference of 180 degrees relative to the adjacent phase-shift region R.

2. The phase-shift mask of claim 1, further comprising the perimeter including four edges, and the phase-shift regions being arranged adjacent each of the four edges.

3. The phase-shift mask of claim 2, further comprising the perimeter including four corners defined by the four edges, with assist phase regions R' respectively arranged adjacent the four corners.

4. The phase-shift mask of claim 1, further comprising the assist phase regions R' arranged immediately adjacent the entire perimeter of the checkerboard array.

5. The phase-shift mask of claim 1, further comprising an opaque layer immediately adjacent a perimeter defined by the assist phase regions R'.

6. A phase-shift mask for use in a photolithographic imaging system having a resolution limit and a wavelength, comprising:
   a mask body having a surface, the mask body generally being transparent to the photolithographic imaging system wavelength;
   a checkerboard array of phase-shift regions R supported by the mask body surface and sized to be at or above the resolution limit, with adjacent regions R having a phase difference of 180 degrees, the array having a perimeter that includes a plurality of edges and four corners; and
   a plurality of assist phase regions R' supported by the substrate surface each sized to be below the resolution limit, with the assist phase regions R' arranged immediately adjacent the plurality of edges and the four corners so as to surround the perimeter, with each assist phase region R' having a phase-shift difference of 180 degrees relative to the adjacent phase-shift region R and relative to the adjacent assist phase region R'.

7. The phase-shift mask of claim 6, further comprising an opaque layer immediately adjacent a perimeter defined by the assist phase regions R'.

8. A method of photolithographically patterning a semiconductor substrate:
   providing a semiconductor substrate having a surface that supports a layer of photoresist;
   photolithographically imaging a phase-shift mask pattern onto the photoresist Layer with a photolithography imaging having a resolution limit, the phase-shift mask pattern comprising a checkerboard array of phase-shift regions R, with adjacent regions R having a phase difference of 180 degrees, the array having a perimeter, and a plurality of assist phase regions R' each sized to be below the resolution limit, with the assist phase regions R' arranged immediately adjacent at least a portion of the perimeter, with each assist phase region R' having a phase-shift difference of 180 degrees relative to the adjacent phase-shift region R; and
   processing the photoresist layer to form a periodic array of photoresist features.

9. The method of claim 8, further comprising:
   processing the photoresist features to create an array of substrate posts that define a roughened substrate surface; and
   forming a p-n junction multilayer structure atop the roughened substrate surface.

10. The method of claim 8, further comprising the substrate being made of sapphire.

11. The method of claim 8, further comprising the photolithographic imaging having a wavelength of nominally 365 nm and a unit magnification.

12. The method of claim 8, wherein the substrate posts have a dimension of one micron or less, and further comprising performing the photolithographic imaging at a numerical aperture of 0.5 or less.

13. The method of claim 8, further comprising an opaque layer immediately adjacent a perimeter defined by the assist phase regions R'.

14. The method of claim 8, wherein the photolithographically imaging includes stitching together exposure fields to create a substantially continuous array of photoresist posts in the photoresist layer over substantially the entire substrate.

* * * * *